United States Patent [19]

Hoeft

[11] 4,339,677
[45] Jul. 13, 1982

[54] ELECTRICALLY VARIABLE IMPEDANCE CIRCUIT WITH FEEDBACK COMPENSATION

[75] Inventor: Werner H. Hoeft, Saratoga, Calif.

[73] Assignee: Signetics Corporation, Sunnyvale, Calif.

[21] Appl. No.: 106,217

[22] Filed: Dec. 21, 1979

[51] Int. Cl.³ .............................................. H03H 7/24
[52] U.S. Cl. .................................. 307/564; 307/562; 307/264; 307/547
[58] Field of Search .............. 307/264, 297, 547, 549, 307/551, 567, 562, 564; 330/254, 282, 284

[56] References Cited

U.S. PATENT DOCUMENTS 3,649,847 3/1972 Limberg ......................... 307/264 X
3,761,741 9/1973 Hoeft ................................. 307/567

Primary Examiner—John Zazworsky
Attorney, Agent, or Firm—Thomas A. Briody; Robert T. Mayer; Steven R. Biren

[57] ABSTRACT

A variable impedance circuit in which nonlinearities caused by the application of a signal are substantially reduced by the use of a feedback circuit for cancelling out the added input current due to the application of the input signal. By using a feedback circuit to obtain the desired improvement in linearity, the gain of the feedback loop can be tailored to obtain the necessary impedance range and output swing in a circuit capable of operating at relatively low power supply voltages.

5 Claims, 3 Drawing Figures

ELECTRICALLY VARIABLE IMPEDANCE CIRCUIT WITH FEEDBACK COMPENSATION

BACKGROUND OF THE INVENTION

This invention relates to a variable impedance circuit of the type having an electrically variable impedance element which utilizes the forward-biased diode characteristic of a transistor base-emitter junction.

A known type of electrically variable impedance control circuit is disclosed in my prior U.S. Pat. No. 3,761,741, which is hereby incorporated by reference in its entirety. As compared to prior art configurations, the invention of my prior patent is able to provide a wide range of impedance values while maintaining a high degree of linearity. Whereas prior art circuits, such as that shown in FIG. 1 of my prior patent, may have a nonlinearity factor as high as 30% due to variations of impedance induced by the signal source, a circuit in accordance with FIG. 4 of my prior patent is capable of operating over a wide impedance range with nonlinearities in the order of only 1.5%.

However, in order to achieve a larger range of electrical impedance values and a larger output swing with my prior art configuration, it is necessary to connect a plurality of diode-connected transistors in series, as shown in FIG. 5 of my earlier patent. While such a circuit is capable of providing a wide range of impedance values as well as a substantial improvement in linearity as compared to prior art devices, this circuit still suffers from a number of significant drawbacks.

Since the circuit of FIG. 5 of my prior patent requires that a series string of ten base-emitter junctions be biased into the active region, and since these base-emitter junctions are connected in series with two further transistors, it is apparent that this prior art circuit requires a power supply voltage of at least about 8 volts for proper operation. In fact, the circuit of FIG. 5 of my prior patent has been used as the variable impedance element of a commercially-produced Dolby processor integrated circuit, and this circuit requires a power supply voltage of at least 8 volts for proper operation. Furthermore, this prior art circuit requires the use of sixteen diode-connected transistors, and even more such transistors must be provided if higher voltage swings are needed. Clearly, such a configuration is both complex and wasteful of chip area.

With the increasing popularity of portable, battery-operated equipment, it has become desirable to achieve the superior performance of my prior variable impedance invention in a circuit capable of operating at lower voltages. In particular, it would be desirable to power such a circuit from a nominal 6 volt battery source, with the circuit capable of functioning down to a minimum of about 4 volts.

SUMMARY OF THE INVENTION

It is accordingly an object of the invention to provide a variable impedance circuit which offers the improved linearity and impedance range characteristics of my prior invention and which additionally is capable of operating at lower power supply voltages.

It is a further object of the invention to provide a variable impedance circuit which is capable of providing a wide range of impedance values and a large output swing without the necessity for a large number of series-connected diodes.

In accordance with the invention, these objects are accomplished by a new variable impedance circuit in which non-linearities caused by the application of a signal are substantially reduced by the use of a feedback circuit for cancelling out the added input current due to the application of the input signal. Furthermore, by using a feedback circuit to obtain the desired improvement in linearity, the gain of the feedback loop can be tailored to get the necessary impedance range and output swing without the need for providing additional series-connected diodes as in my prior circuit. By eliminating these series-connected diodes, the circuit is able to operate at substantially lower voltages.

The present invention is based upon a known type of variable attenuator circuit, as shown in FIG. 1 of my prior patent, in which a series input resistance is shunted at its output terminal by an electrically variable shunt impedance which is formed by appropriately biasing a p-n junction in the active region. In such a configuration, the output voltage is equal to the input voltage multiplied by an attenuation factor which is equal to the shunt junction resistance divided by the sum of the shunt junction resistance plus the series input resistance.

In the present invention, this electrically variable shunt impedance is provided by at least two diode-connected transistors which are connected in series with like polarity between the output terminal of a resistive signal line and a common terminal. In this application, diode-connected transistors will hereinafter be referred to simply as diodes, and will be illustrated in the drawing by the diode symbol. However, it should be understood that wherever the term diode is used, or a diode symbol shown, a diode-connected transistor (that is, a transistor with its base and collector terminals connected together) is in fact intended. The desired quiescent shunt impedance value of these series-connected diodes is established by a current source which is connected to the output of the resistive signal line. By setting the current level of the current source to a selected value, the impedance of the series-connected diodes can be set to the desired value as described in my earlier patent. In order to compensate for nonlinearities caused by changes in input impedance due to the application of a signal, a feedback connection is provided from the junction between the two series-connected diodes to the output terminal in order to maintain the diode current, and thus the shunt impedance value of the diodes, at a substantially constant level.

In the illustrative embodiments, the feedback circuit includes a transistor with its base zone connected to the junction between the two diodes, its emitter zone connected to the common terminal of the circuit, and its collector zone connected either directly or through a pair of current mirrors back to the output terminal of the resistive signal line.

In a further embodiment, the variable impedance circuit includes a differential amplifier circuit for providing a differential output signal.

The invention may be more completely understood with reference to the following detailed description, to be read in conjunction with the accompanying drawing.

DETAILED DESCRIPTION

Figure 1:
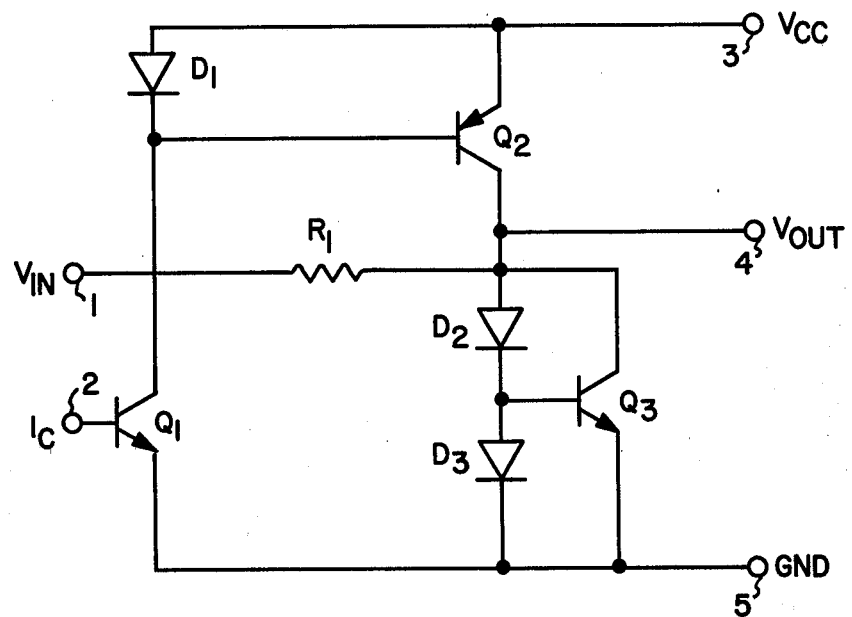
FIG. 1 is a schematic diagram of a variable impedance circuit in accordance with the invention.

A basic variable impedance circuit in accordance with the present invention is shown in FIG. 1. An input signal $V_{in}$ is applied an input terminal 1 of a resistive signal line having a resistance value $R_1$. An electrically variable shunt impedance element comprising series-connected diodes $D_2$ and $D_3$ is connected from an output terminal 4 of the resistive line to a common terminal 5, in this case ground. Thus, the circuit will generate an output voltage $V_{out}$ at terminal 4 which is proportional to the input signal $V_{in}$ multiplied by an attenuation factor which is equal to the ratio of the shunt impedance value of the series-connected diodes $D_2$ and $D_3$ to the the sum of $R_1$ plus the shunt impedance value.

The quiescent value of this shunt impedance is determined by a current source which comprises the components $Q_1$, $D_1$ and $Q_2$. A control current $I_c$ is applied to an input terminal 2 which is connected to the base of transistor $Q_1$. This control current sets up a desired reference current in the collector circuit of transistor $Q_1$, which reference current is reflected by the current mirror composed of diode $D_1$ and transistor $Q_2$ to provide a reference current through the collector of transistor $Q_2$ and into the variable impedance element composed of diodes $D_2$ and $D_3$. In this manner a desired quiescent shunt impedance level across the output of the resistive signal line may be established by providing an appropriate control current $I_c$ at terminal 2.

However, as described more fully in my prior U.S. Pat. No. 3,761,741, when an AC input signal $V_{in}$ is applied to input terminal 1, the resulting AC output signal $V_{out}$ on terminal 4 will tend to change the quiescent current level through diodes $D_2$ and $D_3$, thereby changing the shunt impedance value of the series-connected diodes. This change in impedance level with the application of an AC signal, if not compensated for, will result in substantial nonlinearities in the output signal, which may be as high as 30 percent. In order to compensate for such nonlinearities, a feedback transistor $Q_3$ is provided with its base zone connected to the junction between series-connected diodes $D_2$ and $D_3$, its emitter zone connected to common or ground terminal 5, and its collector zone connected to output terminal 4. The purpose of this transistor is to sense changes in the quiescent current level through the series-connected diodes, and to compensate for these changes by drawing off a greater or lesser share of the reference current flowing out of the collector of transistor $Q_2$ in order to maintain the diode current substantially constant with changes in input signal. For illustration, assume a positive-going input signal $V_{in}$ at input terminal 1 of the resistive signal line. This will cause a corresponding increase in the output voltage $V_{out}$ at terminal 4, which will in turn tend to increase the current through diodes $D_2$ and $D_3$. However, this increase in current through the diodes will be mirrored in transistor $Q_3$, thus resulting in an increase in its collector current. In this manner, the excess current that would otherwise flow through diodes $D_2$ and $D_3$ is instead sunk to ground through transistor $Q_3$. By appropriately selecting the ratio of emitter peripheries of diode $D_3$ (which is in fact a diode-connector transistor, as mentioned above) and transistor $Q_3$, the loop gain can be adjusted to maintain the current through diodes $D_2$ and $D_3$ substantially constant with a varying input signal while obtaining the desired impedance range and output swing. By keeping this diode current substantially constant, the shunt impedance level across output terminal 4 is maintained substantially constant and nonlinearities are considerably reduced, to about 1 to 2 percent. Furthermore, since there are no lengthy strings of series-connected base-emitter junctions, as were necessary in my prior invention to achieve sufficient dynamic range, the circuit of FIG. 1 is capable of operating with a nominal power supply voltage of 6 volts, and the circuit will operate properly with a supply voltage as low as about 4 volts. Due to the feedback provided by transistor $Q_3$, sufficient dynamic range is obtained without the necessity for a large string of series-connected diodes.

Figure 2:
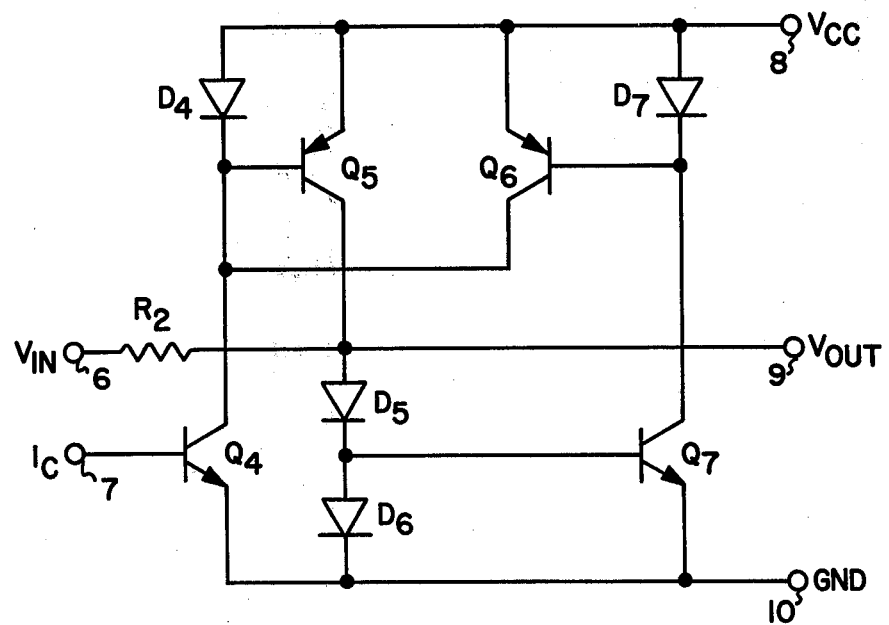
FIG. 2 is a schematic diagram of a further embodiment of a variable impedance circuit in accordance with the invention.

FIG. 2 shows an alternate embodiment of an electrically variable impedance circuit in accordance with the invention. Many portions of the circuit of FIG. 2 are identical to the corresponding portions of FIG. 1, and the description of those parts of FIG. 1 likewise applies to the corresponding parts of FIG. 2. FIG. 2 differs from FIG. 1 mainly in that the collector of feedback transistor $Q_7$, rather than being connected directly to the output terminal as in FIG. 1, is now connected to the input of a current mirror composed of transistor $Q_6$ and diode $D_7$. The output of this current mirror is connected to the input of a further current mirror composed of transistor $Q_5$ and diode $D_4$. The input of this current mirror is also connected to the output of control current transistor $Q_4$, which corresponds to transistor $Q_1$ in FIG. 1. The output of the further current mirror, at the collector of transistor $Q_5$, is then connected to output terminal 9 of the variable impedance circuit.

In operation, a control current is applied to control terminal 7 of the circuit to establish a reference current in diodes $D_5$ and $D_6$ through the further current mirror composed of diode $D_4$ and transistor $Q_5$. When the reference current flows through diodes $D_5$ and $D_6$, transistor $Q_7$ will be biased as a function of the voltage at the junction between these two diodes. As a result, collector current will flow in transistor $Q_7$, and this collector current will be mirrored by the current mirror $Q_6$-$D_7$ to generate a collector current in transistor $Q_6$. This collector current, plus the current flowing out of $D_4$ of the further current mirror will equal the control current flowing into the collector of $Q_4$. When an input signal $V_{in}$ is applied to input terminal 6, the voltage at output terminal 9 will change, and this change will, if not compensated for, tend to cause a change in the current through series-connected diodes $D_5$ and $D_6$, thus tending to cause an undesirable change in the shunt impedance of these diodes. To visualize how this impedance change is compensated for in the present invention, assume that the input voltage at terminal 6 increases, thus causing an increase in the current flow through diodes $D_5$ and $D_6$. This will in turn cause an increase in the collector current in transistor $Q_7$, the input of which is coupled to the junction between the two diodes. The increase in collector current in transistor $Q_7$ will be mirrored in the current mirror $Q_6$-$D_7$ to cause an increase in the collector current of transistor $Q_6$. Since, as already described, the current out of the common node connecting $Q_6$, $D_4$ and $Q_4$ is the constant control current, an increase in current flowing into this node from transistor $Q_6$ must be balanced by a like decrease in current provided by diode $D_4$ of the further current mirror. This decrease in current will be mirrored by the further current mirror to cause a decrease in the collector current of $Q_5$. Since the collector current of transistor $Q_5$ provides the reference current to diodes $D_5$ and $D_6$, it may be seen that the original increase in current due to an increase in input voltage has been compensated for by a like decrease in reference current to the diodes, thus maintaining the current through the diodes, and their impedance level, substantially constant with changes in input voltage. Thus, the circuit of FIG. 2 utilizes the same basic feedback concept as the circuit of FIG. 1, but in a slightly more complex configuration. However, the two additional current mirrors present in the circuit of FIG. 2 afford a higher feedback loop gain, resulting in further improvements in linearity and dynamic range.

Figure 3:
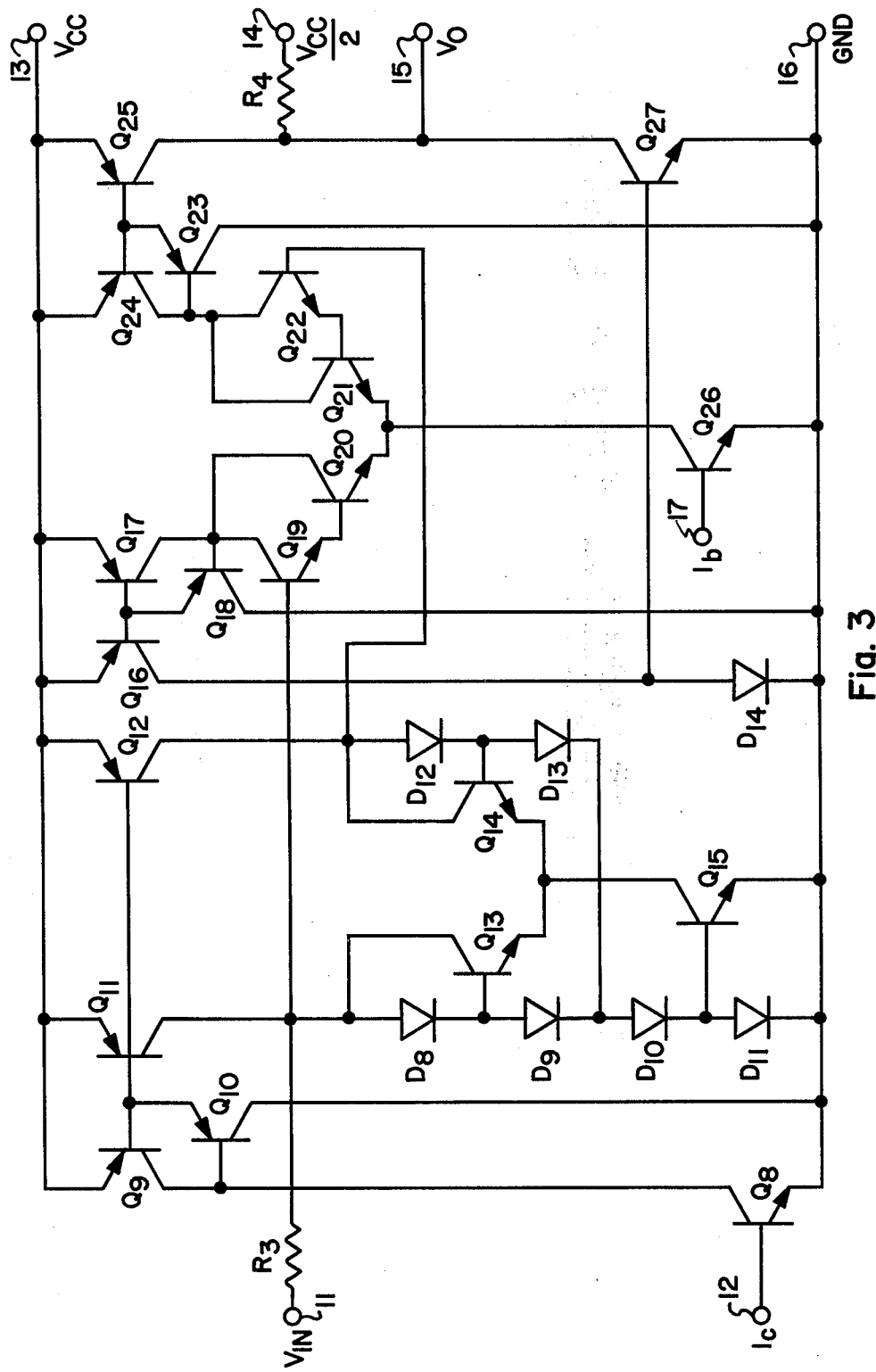
FIG. 3 is a variable impedance circuit incorporating the basic concept of FIG. 1 in a differential amplifier circuit.

In the circuit of FIG. 3, the basic configuration of FIG. 1 is employed in a more complex circuit using a differential amplifier configuration, as actually incorporated in a Dolby processor suitable for use in low-voltage applications. In FIG. 3, a control current applied to input terminal 12 generates two reference current outputs through current mirror $Q_9$-$Q_{10}$-$Q_{11}$-$Q_{12}$, the two reference current outputs being taken from the collectors of transistors $Q_{11}$ and $Q_{12}$. These reference currents are provided, respectively, to diode strings $D_8$-$D_9$ and $D_{12}$-$D_{13}$, and the sum of these two reference currents is passed through diodes $D_{10}$ and $D_{11}$. A differential amplifier comprising transistors $Q_{13}$ and $Q_{14}$ is biased via diode $D_{11}$ and transistor $Q_{15}$, with the collector current inputs to these transistors being provided by transistors $Q_{11}$ and $Q_{12}$ respectively. As in previous examples, an input signal $V_{in}$ is applied to an input terminal 11 of a resistive signal line having a resistance $R_3$ and an electrically variable shunt impedance element, in this case comprising diode string $D_8$-$D_9$-$D_{10}$-$D_{11}$, is connected from the output of the resistive signal line to common or ground terminal 16.

Reference current to the diode strings is provided by a current mirror composed of transistors $Q_9$, $Q_{10}$, $Q_{11}$ and $Q_{12}$. In the circuit of FIG. 3, the current mirrors employ a slightly different circuit configuration from that described previously. The input transistor of each current mirror in FIG. 3 (transistors $Q_9$, $Q_{17}$ and $Q_{24}$) has the base-emitter junction of a further transistor ($Q_{10}$, $Q_{18}$ and $Q_{23}$ respectively) connected across its collector-base junction, rather than a direct short, to create a diode-connected transistor as in the current mirrors of FIG. 2. The purpose of this modification is simply to increase the gain of the input circuit and thereby reduce the effect of base current on the accuracy of the current mirror. The current mirror having input transistors $Q_9$ and $Q_{10}$ includes a pair of output transistors $Q_{11}$ and $Q_{12}$ having parallel-connected base and emitter junctions. These two parallel-connected output transistors provide reference currents to diode strings $D_8$-$D_9$ and $D_{12}$-$D_{13}$, respectively.

Impedance control is achieved in a manner similar to that described previously with respect to FIG. 1. As in FIG. 1, the impedance of the diode string connected across the signal line would tend to change with changes in input signal without compensation. Again, taking the case of an increasing input signal voltage, the current through diode string $D_8$-$D_9$-$D_{10}$-$D_{11}$ would tend to increase due to the increase in applied voltage. However, this increased current is sensed by transistor $Q_{15}$, which in turn increases the current flow in differential amplifier transistor $Q_{13}$, thus reducing the current through $Q_{14}$, and maintaining a constant voltage and impedance at the junction of $Q_{14}$ (collector) and $D_{12}$ (anode). The net result is that the differential amplifier transistors will act as a current sink in a differential mode for the additional current, thus causing the current in diode string $D_8$-$D_9$-$D_{10}$-$D_{11}$, and thus its impedance, to remain substantially constant. Since the steady-state current in the diode string remains substantially constant, the steady-state collector current in transistor $Q_{15}$ (supplied by transistors $Q_{13}$ and $Q_{14}$) also remains substantially constant, with the increase in collector current in transistor $Q_{13}$ being compensated for by a decrease in collector current in transistor $Q_{14}$.

The differential outputs of amplifier $Q_{13}$-$Q_{14}$ are connected to a Darlington differential buffer amplifier $Q_{19}$-$Q_{20}$-$Q_{21}$-$Q_{22}$, and the differential outputs of this buffer amplifier are coupled via current mirrors $Q_{16}$-$Q_{17}$-$Q_{18}$ and $Q_{23}$-$Q_{24}$-$Q_{25}$ to a complementary output stage $D_{14}$-$Q_{25}$-$Q_{27}$ which drives a load resistor $R_4$ connected to output terminal 15. Bias current for the Darlington differential amplifier is provided by transistor $Q_{26}$, which is in turn controlled by a bias control current input $I_b$ at bias input terminal 17. Since the buffer amplifier has its own current source, the circuit provides excellent isolation. Furthermore, circuit performance is enhanced by the common mode rejection achieved by incorporating the basic variable impedance circuit of FIG. 1 into the differential mode and buffer amplifier configuration of FIG. 3.

While the invention has been particularly shown and described with reference to certain preferred embodiments, it will be understood by those skilled in the art that various changes in form and detail may be made without departing from the spirit and scope of the invention.

What I claim is:

1. A variable impedance voltage attenuator circuit for providing an electrically variable shunt impedance between an output terminal of a series resistive signal line and a common terminal, which comprises:
   at least first and second diodes connected in series with like polarity between said resistive signal line output terminal and said common terminal to form a shunt impedance therebetween, said first diode being connected to said output terminal;
   current source means connected to said output terminal for passing a current through said series-connected diodes to establish a desired quiescent shunt impedance value between said output and common terminals; and
   feedback circuit means connected from the junction between said first and second series-connected diodes to said output terminal for maintaining said diode current at a substantially constant level with changes in signal level at said output terminal to maintain the shunt impedance value of said diodes substantially constant.

2. A variable impedance circuit as in claim 1, wherein said feedback circuit means comprises a bipolar transistor having a base zone connected to said junction between the series-connected diodes, an emitter zone connected to the common terminal, and a collector zone connected to said output terminal.

3. A variable impedance circuit as in claim 1, wherein said current source means comprises a control current source and a first current mirror, and said feedback circuit comprises a second current mirror and a bipolar transistor having a base zone connected to the junction between said series-connected diodes, an emitter zone connected to the common terminal and a collector zone connected to the input of said second current mirror, the output of said second current mirror and the input of said first current mirror being connected together and to the output of said control current source, and the output of said first current mirror being connected to the output terminal.

4. A variable impedance circuit as in claim 1, further comprising third and fourth diodes connected in series with said first and second diodes, with like polarity to said first and second diodes and to each other, said third diode being connected to said second diode and said fourth diode being connected between said third diode and said common terminal, said feedback circuit means comprising a first bipolar transistor having a base zone connected to the common junction between said first and second series-connected diodes, a collector zone connected to said output terminal and an emitter zone; a second bipolar transistor having a base zone connected to the junction between said third and fourth series-connected diodes, a collector zone connected to the emitter zone of said first transistor, and an emitter zone connected to said common terminal; a third bipolar transistor having a base zone, a collector zone connected to said current source means, and an emitter zone connected to the emitter of said first transistor; fifth and sixth diodes connected in series with like polarity, said fifth diode being connected between the collector and base zones of said third transistor and said sixth diode being connected from the base zone of said third transistor to the junction between said second and third diodes, and differential amplifier means having input terminals connected to the collectors of said first and third transistors and output terminals for providing a signal proportional to the value of said shunt impedance.

5. A variable impedance circuit as in claim 4, wherein said differential amplifier means comprises a Darlington differential amplifier having differential input terminals connected to the collectors of said first and third transistors and differential output terminals, first and second current mirrors having input terminals connected respectively to said differential amplifier output terminals and output terminals, and a complementary series-connected output amplifier having input terminals connected respectively to the output terminals of said current mirrors and an output for providing a signal proportional to the value of said shunt impedance.

* * * * *